United States Patent [19]
Sakamoto et al.

[11] Patent Number: 5,968,593
[45] Date of Patent: Oct. 19, 1999

[54] SEMICONDUCTOR MANUFACTURING APPARATUS

[75] Inventors: Ichiro Sakamoto; Naoto Nakamura, both of Tokyo, Japan

[73] Assignee: Kokusai Electric Co., Ltd., Tokyo, Japan

[21] Appl. No.: 08/618,769

[22] Filed: Mar. 20, 1996

[30] Foreign Application Priority Data

Mar. 20, 1995 [JP] Japan .................................... 7-087485

[51] Int. Cl.⁶ .................................................. C23C 16/00
[52] U.S. Cl. ...................... 427/248.1; 118/715; 438/758
[58] Field of Search ......................... 118/715; 427/248.1; 438/758

[56] References Cited

FOREIGN PATENT DOCUMENTS

| | | |
|---|---|---|
| 1-08121 | 3/1989 | Japan . |
| 4130433 | 11/1992 | Japan . |
| 529936 | 11/1993 | Japan . |
| 6326079 | 11/1994 | Japan . |
| 6333867 | 12/1994 | Japan . |

*Primary Examiner*—Richard Bueker

[57] ABSTRACT

A semiconductor manufacturing apparatus including a heating device; a reaction tube disposed within the heating device, the reaction tube having a gas inlet portion and an exhaust portion parted from each other by a predetermined distance in the longitudinal direction of the reaction tube; and a plurality of gas feed pipes extending along a side wall of the reaction tube from the exhaust portion side to the gas inlet portion, the plurality of gas feed pipes being parted from each other. The reaction gas is provided through the plurality of gas feed pipes into the reaction tube, thereby providing an improved uniform temperature distribution within the reaction tube and resulting in an improved uniform film thickness of the oxide film formed on the surface of the semiconductor wafer.

12 Claims, 9 Drawing Sheets

SEMICONDUCTOR MANUFACTURING APPARATUS

BACKGROUND OF THE INVENTION

1. Field of the Invention

The present invention relates to a semiconductor manufacturing apparatus, and particularly to a semiconductor manufacturing apparatus in which various processes such as oxidation, diffusion, and thermal treatment are performed for semiconductor wafers.

2. Description of the Related Art

The manufacture of semiconductors includes a process of forming a thermal oxidation film on the surface of a silicon wafer. This process is performed using, for example, a vertical-type semiconductor manufacturing apparatus shown in FIGS. 1A and 1B.

Figure 1A:
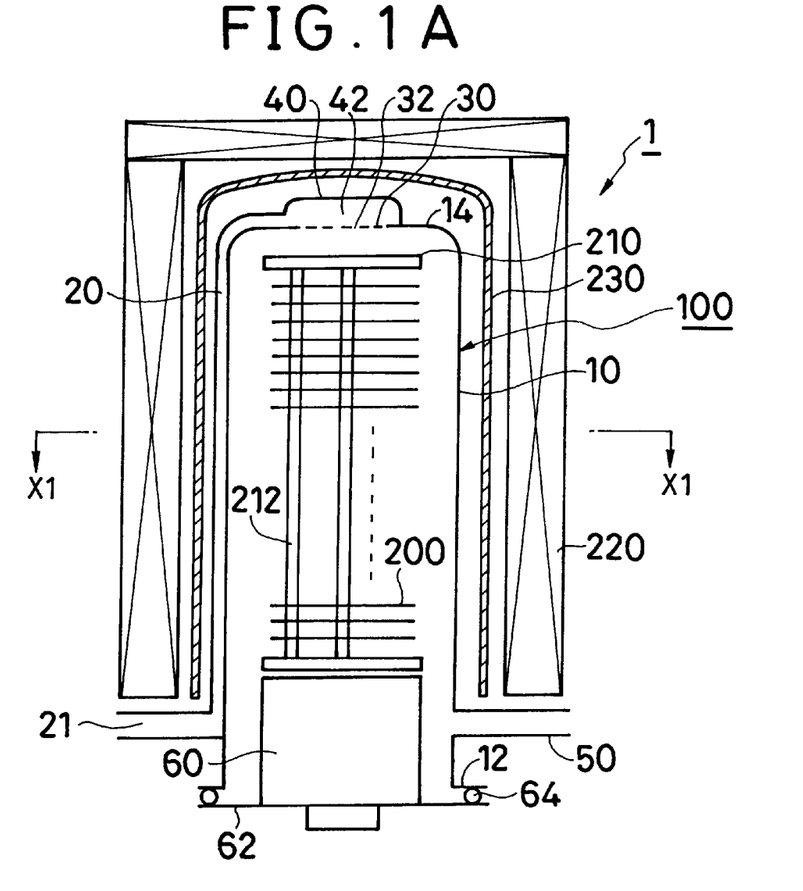
FIG. 1A is a cross-sectional view for explaining a conventional semiconductor manufacturing apparatus.
Figure 1B:
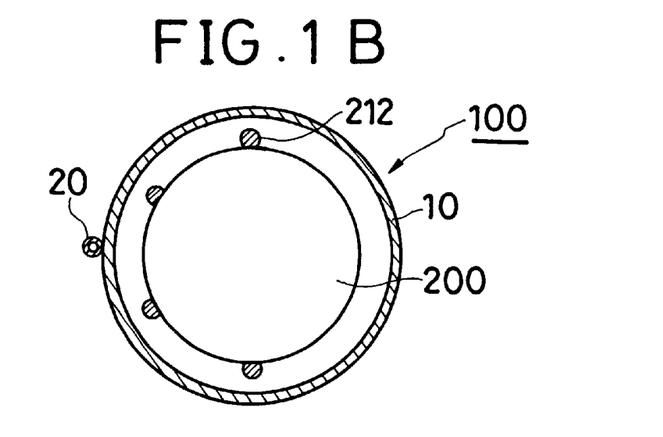
FIG. 1B is a cross-sectional view taken along the line X1—X1 of FIG. 1A.

FIG. 1A shows a cross-section of the conventional semiconductor manufacturing apparatus 1. FIG. 1B shows a cross-section taken along a line X1—X1 of FIG. 1A.

As shown in FIGS. 1A and 1B, in the semiconductor manufacturing apparatus 1, a liner tube 230 is disposed within a hollow heater 220, and a reaction tube 100 is disposed within the liner tube 230. The liner tube 230 is formed of a material having a large thermal capacity and its function is to provide a uniform temperature distribution within a furnace. The reaction tube 100 has a reaction tube body 10 having a circular cross-section and a single gas feed pipe 20. An upper gas feed pipe 40 is disposed on a ceiling plate 14 of the reaction tube body 10. The upper gas feed pipe 40 and the ceiling plate 14 define a shower chamber 42. A portion of the ceiling plate 14 located within the shower chamber 42 serves as a gas shower plate 30 having a plurality of gas diffusion holes 32. The shower chamber 42 communicates with the interior of the reaction tube body 10 through the gas shower plate 30. The gas feed pipe 20 is vertically provided along a generatrix of the reaction tube body 10 and on the outer surface of the reaction tube body 10. A gas inlet portion 21 is provided at the lower end portion (upstream-side end portion) of the gas feed pipe 20, and the upper end portion (downstream-side end portion) thereof communicates with the shower chamber 42 located at the top portion of the reaction tube body 10. An exhaust pipe 50 is provided adjacent to the lower end of the reaction tube body 10 such that it communicates with the reaction tube body 10. The gas inlet portion 21 is connected to a reaction gas source (not shown), and the exhaust pipe 50 is connected to an exhauster (not shown).

A boat 210 is raised and lowered by a boat elevator (not shown), thereby introducing the boat 210 into the reaction tube body 10 or removing the boat 210 therefrom. The boat 210 stands on a boat cap 60, which is provided on a furnace cover 62. A flange 12 is provided along the periphery of the reaction tube body 10 at the lowermost end thereof. An O-ring 64 is interposed between the flange 12 and the furnace cover 62, thereby maintaining the reaction tube body 10 in an airtight state.

The boat 210 has four boat support shafts 212, on which a plurality of wafers 200 are loaded in a horizontal posture such that one wafer is located above another. Each wafer 200 loaded in the boat 210 undergoes oxidation to form an oxide film on the surface thereof.

For oxidation of the wafers 200, while the interior of the furnace and the wafers 200 are heated to and maintained at an oxidation temperature, the oxygen gas is fed to the shower chamber 42 through the gas feed pipe 20 and then diffused into the reaction tube body 10 through the gas diffusion holes 32 formed in the gas shower plate 30. The oxygen gas reacts with the wafers 200 to form oxide films on the wafer surfaces. The gas after reaction is discharged through the exhaust pipe 50.

The length of the reaction gas feed pipe 20 is substantially identical to that of the portion of the reaction tube body 10 located within the heater 220 and within the liner tube 230. Conceptually, oxygen gas is heated in the following manner. Oxygen gas introduced from the gas inlet portion 21 at around room temperature is heated while passing through the gas feed pipe 20. When the oxygen gas reaches the shower chamber 42, it reaches a temperature substantially equal to that of the inside of the reaction tube body 10 and the wafers 200 contained therein. The thus heated oxygen gas enters the reaction tube body 10.

However, since the oxygen gas fed from the gas inlet portion 21 has a temperature close to the room temperature, the temperature difference between the gas feed pipe 20 and the interior of the furnace increases toward the upstream-side portion of the gas feed pipe 20 and the amount of heat absorbed from the interior of the furnace increases accordingly. Hence, when the oxygen gas is fed through a single gas feed pipe 20, the upstream-side portion of the gas feed pipe 20 causes cooling in the portions of the wafers 200 located near the gas feed pipe 20. Particularly, this causes nonuniform temperature distribution over the wafer surface. As a result, since the wafer temperature affects the growth rate of oxide film, oxide film is formed having a nonuniform thickness over the wafer surface.

SUMMARY OF THE INVENTION

In view of the foregoing, a main object of the present invention is to provide a semiconductor manufacturing apparatus capable of providing an improved uniform temperature distribution over the surface of a wafer.

According to the present invention, there is provided a semiconductor manufacturing apparatus, comprising:

heating means;

a reaction tube disposed within the heating means, the reaction tube having a gas inlet portion and an exhaust portion parted from each other by a predetermined distance in the longitudinal direction of the reaction tube; and a plurality of gas feed pipes extending along a side wall of the reaction tube from the exhaust portion side to the gas inlet portion, the plurality of gas feed pipes being parted from each other.

As a result of providing a plurality of gas feed pipes, an improved uniform temperature distribution within the reaction tube can be achieved, particularly over a surface perpendicular to the longitudinal direction.

Since the apparatus structure is such that a plurality of gas feed pipes are attached to the reaction tube, cost of manufacture is cheap, and the weight of the apparatus is relatively light, so that maintenance workers can easily carry the reaction pipe for maintenance.

Preferably, the semiconductor manufacturing apparatus of the present invention further comprises substrate holding means capable of holding a substrate to be processed within the reaction tube such that a main surface of the substrate lies substantially perpendicularly to the longitudinal direction.

Preferably, the semiconductor manufacturing apparatus of the present invention further comprises substrate holding means capable of holding a plurality of substrates to be processed within the reaction tube such that one substrate is located above another substrate in the longitudinal direction, and such that respective main faces of the plurality of the substrates lie substantially perpendicularly to the longitudinal direction.

As a result of holding a substrate perpendicularly to the longitudinal direction, a more uniform temperature distribution over the surface of a substrate is achieved.

Preferably, in the semiconductor manufacturing apparatus of the present invention, the reaction tube has a circular cross-section. The reaction tube having such a shape is preferably applicable to the case where the substrate is a semiconductor wafer.

In this case, preferably, the plurality of gas feed pipes are disposed around the reaction tube at substantially constant intervals. This results in a more uniform temperature distribution over the surface of a substrate.

The semiconductor manufacturing apparatus of the present invention may further has a gas supply apparatus capable of independently controlling a flow rate of gas to be supplied to each of the plurality of gas feed pipes. In this case, the supply rate of gas supplied to the gas feed pipe(s) located adjacently to a higher-temperature region of a surface of a substrate can be made greater than the supply rate of gas supplied to other gas feed pipes, whereby temperature distribution over the surface of the substrate becomes more uniform.

Preferably, the semiconductor manufacturing apparatus of the present invention further comprises:

a connecting pipe communicating with a gas inlet portion of each of the plurality of gas feed pipes and being provided along the side wall of the reaction tube; and a gas supply pipe communicating with the connecting pipe.

Preferably, the semiconductor manufacturing apparatus of the present invention further comprises:

a gas distribution chamber provided along the side wall of the reaction tube at the exhaust portion side, the gas distributing chamber being provided around the reaction tube and having a predetermined length in the longitudinal direction, and one longitudinal end portion of the gas distribution chamber communicating with the gas inlet portion of each of the plurality of gas feed pipes; and a gas supply pipe communicating with the gas distribution chamber, the gas supply pipe being provided at a position longitudinally separated by a predetermined distance from the one end portion of the gas distribution chamber toward the other end portion of the gas distribution chamber.

As a result of providing the gas distribution chamber, the flow rate of gas led into the plurality of gas feed pipes becomes uniform among the gas feed pipes, thereby resulting in an improved uniform temperature distribution.

In the semiconductor manufacturing apparatus of the present invention, a porous material may be disposed within the gas distribution chamber. This accelerates dispersion of gas, and hence the flow rate of gas led into the plurality of gas feed pipes becomes more uniform among the gas feed pipes, thereby making temperature distribution more uniform.

Preferably, the inner diameter of each of the plurality of gas feed pipes and the diameter of each of gas outlet holes provided between the plurality of gas feed pipes and the gas distribution chamber are gradually increased from a side where the gas supply pipe exists toward the opposite side. As a result, the flow rate of gas flowing through the plurality of gas feed pipes becomes more uniform among the gas feed pipes, thereby making temperature distribution more uniform.

Also, the pitch of the plurality of gas feed pipes may be gradually decreased from a side where the gas supply pipe exists toward the opposite side. As a result, the cooling effect of gas flowing through the plurality of gas feed pipes tends to become uniform around the reaction tube, thereby making temperature distribution more uniform.

Alternatively, the plurality of gas feed pipes may be wound around the side wall of the reaction tube. This disperses the cooling effect of gas flowing through the plurality of gas feed pipes, whereby temperature distribution becomes more uniform.

Also, preferably, at least either of the plurality of gas feed pipes and the gas distribution chamber is disposed inside the reaction tube. This facilitates washing of the reaction tube.

Preferably, at least part of the gas distribution chamber is disposed within the heating means. As a result, the gas distribution chamber serves not only as a gas distribution chamber but as a gas heating chamber for preheating gas, thereby preheating gas before it is introduced into the gas feed pipes. Consequently, the cooling effect of gas flowing through the gas feed pipes is suppressed.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 2A:
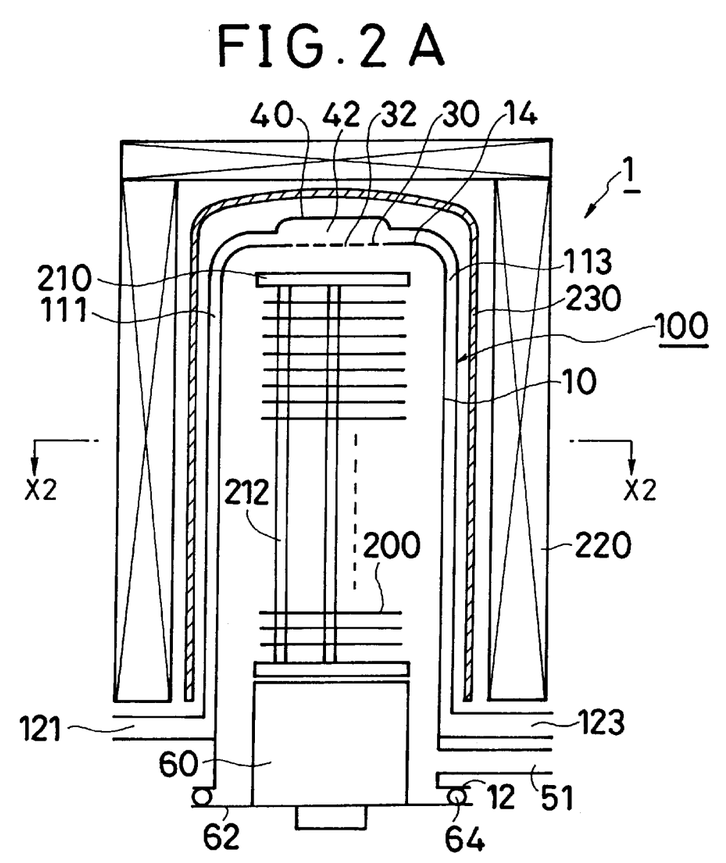
FIG. 2A is a cross-sectional view for explaining a semiconductor manufacturing apparatus according to a first embodiment of the present invention.
Figure 2B:
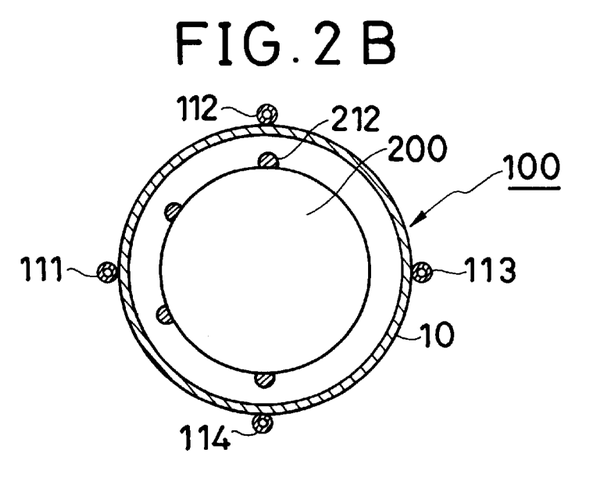
FIG. 2B is a cross-sectional view taken along a line X2—X2 of FIG. 2A.
Figure 3:
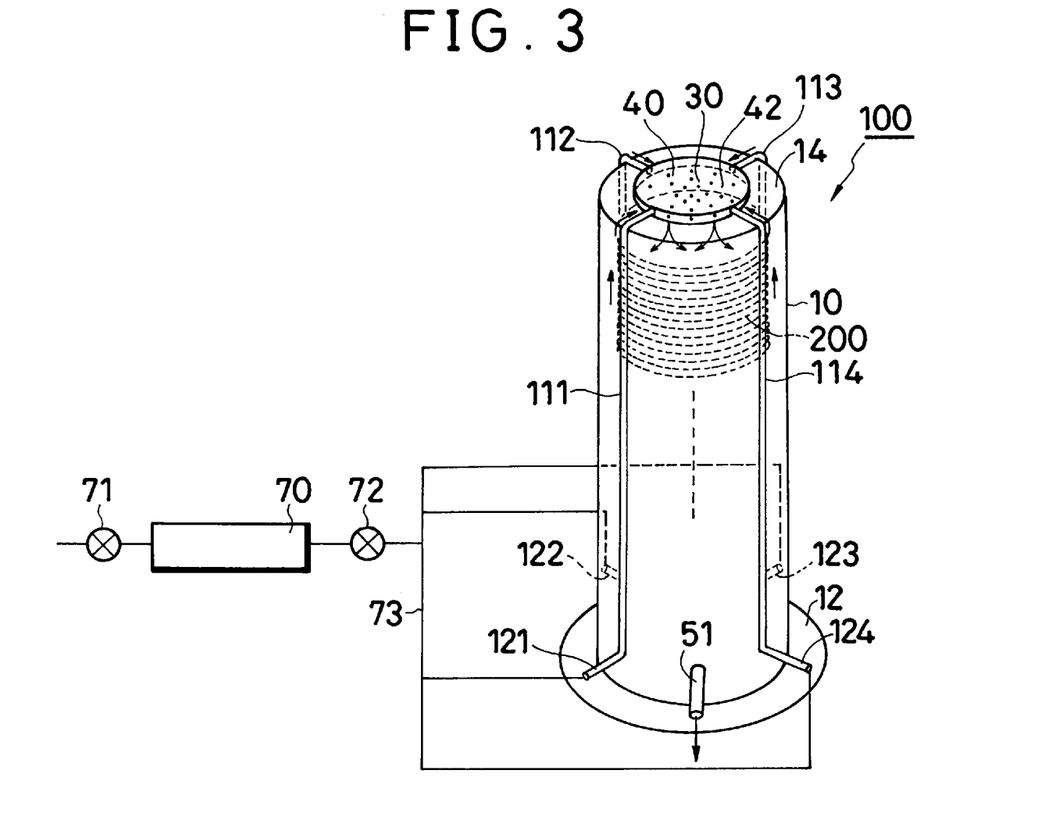
FIG. 3 is a perspective partial view for explaining the semiconductor manufacturing apparatus according to the first embodiment of the present invention.

First embodiment:

FIG. 2A is a cross-sectional view for explaining a semiconductor manufacturing apparatus according to a first embodiment of the present invention. FIG. 2B is a cross-sectional view taken along the line X2—X2 of FIG. 2A. FIG. 3 is a perspective partial view for explaining the semiconductor manufacturing apparatus according to the first embodiment.

In the semiconductor manufacturing apparatus 1, a liner tube 230 is disposed within a hollow heater 220, and a reaction tube 100 is disposed within the liner tube 230. The liner tube 230 is formed of a material having a large thermal capacity (for example, SiC) and its function is to provide a uniform temperature distribution within a furnace. The reaction tube 100 has a reaction tube body 10 having a circular cross-section and four gas feed pipes 111 to 114. An upper gas feed pipe 40 is disposed on the ceiling plate 14 of the reaction tube body 10. The upper gas feed pipe 40 and the ceiling plate 14 define a shower chamber 42. A portion of the ceiling plate 14 located within the shower chamber 42 serves as a gas shower plate 30 having a plurality of gas diffusion holes 32. The shower chamber 42 communicates with the interior of the reaction tube body 10 through the gas shower plate 30. The gas feed pipes 111 to 114 are provided around the reaction tube body 10 at constant angular intervals of 90° such that they extend vertically along the peripheral surface of the reaction tube body 10. The gas feed pipes 111 to 114 are provided in the generatrix direction of the reaction tube body 10 and on the outer surface of the reaction tube body 10. Gas inlet portions 121 to 124 are provided at the lower end portions (upstream-side end portions) of the gas feed pipes 111 to 114, respectively. The upper-end portions (downstream-side end portions) of the gas feed pipes 111 to 114 communicate with the shower chamber 42 at circumference positions equally spaced at constant angular intervals of 90°. The gas feed pipes 111 to 114 have the same inner and outer diameters. An exhaust pipe 51 is provided adjacent to the lower end of the reaction tube body 10 such that it communicates with the reaction tube body 10. The gas inlet portions 121 to 124 are connected to a reaction gas source (not shown) via a gas feed piping 73, a valve 72, a mass flow controller 70, and a valve 71. The exhaust pipe 51 is connected to an exhauster (not shown).

A boat 210 is raised and lowered by a boat elevator (not shown), thereby introducing the boat 210 into the reaction tube body 10 or removing the boat 210 therefrom. The boat 210 stands on a boat cap 60, which is provided on a furnace cover 62. A flange 12 is provided along the periphery of the reaction tube body 10 at the lowermost end thereof. An O-ring 64 is interposed between the flange 12 and the furnace cover 62, thereby maintaining the reaction tube body 10 in an airtight state.

The boat 210 has four boat support shafts 212, on which a plurality of wafers 200 are loaded in a horizontal posture such that one wafer is located above another. Each wafer 200 loaded in the boat 210 undergoes oxidation to form an oxide film on the surface thereof.

For oxidation of the wafers 200, while the interior of the furnace and the wafers 200 are heated to and maintained at an oxidation temperature, the oxygen gas is fed to the shower chamber 42 through the gas feed pipes 111 to 114 and then diffused into the reaction tube body 10 through the gas diffusion holes 32 formed in the gas shower plate 30. The oxygen gas reacts with the wafers 200 to form oxide films on the wafer surfaces. The gas after reaction is discharged through the exhaust pipe 51.

The length of the reaction gas feed pipes 111 to 114 is substantially identical to that of the portion of the reaction tube body 10 located within the heater 220 and within the liner tube 230. Conceptually, oxygen gas is heated in the following manner. Oxygen gas introduced from the gas inlet portions 121 to 124 at around room temperature is heated while passing through the gas feed pipes 111 to 114. When the oxygen gas reaches the shower chamber 42, it reaches a temperature substantially equal to that of the inside of the reaction tube body 10 and the wafers 200 contained therein. The thus heated oxygen gas enters the reaction tube body 10.

In the present embodiment, the oxygen gas is fed through four gas feed pipes 111 to 114 which are disposed around the reaction tube body 10 spaced equally and have the same inner diameter. Thus, substantially uniform conditions are established around the reaction tube body 10, thereby avoiding locally cooling the surfaces of the wafers 200. This improves the uniformity of thickness of an oxide film formed by thermal oxidation.

Although the number of gas feed pipes was four in the present embodiment, we performed the following experiment while changing the number of gas feed pipes from one to four. That is, we varied the number of gas feed pipes and measured the wafer temperature at the bottom portion of the boat 210 (i.e. adjacent to the upstream portion of the gas feed pipes) and uniformity of thickness of oxide films formed on the wafers 200 located at the top, central, and bottom portions of the boat 210. The experiment was performed in the following conditions: the interior of the furnace was set to the temperature of 800° C.; and the total amount of oxygen to be led into the reaction tube body 10 through the gas feed pipes was fixed to 20 SLM. The gas feed pipes were disposed around the reaction tube body 10 spaced equally. Results of the experiments are shown in Table 1.

TABLE 1

| Number of gas feed pipes | 1 | 2 | 3 | 4 |
|---|---|---|---|---|
| Total gas flow rate (SLM) | 20 | 20 | 20 | 20 |
| Gas flow rate per gas feed pipe (SLM) | 20 | 10 | 6.67 | 5 |
| Wafer temp. at bottom portion of the boat (°C.) | 793.8 | 797.0 | 799.2 | 799.9 |
| Uniformity of the film thickness within the surface of the wafer (± %) (Dry oxidation at 800° C.) | | | | |
| Top (downstream) | 0.79 | 0.77 | 0.70 | 0.68 |
| Center | 1.56 | 1.45 | 1.44 | 1.43 |
| Bottom (upstream) | 2.29 | 1.39 | 1.21 | 1.03 |

As seen from Table 1, as the number of gas feed pipes increases, the gas flow rate per gas feed pipe decreases, resulting in a reduced local temperature drop on the wafer surface. This brings about an improved uniformity of film thickness over the entire wafer surface and particularly at the bottom portion of the boat, which is significantly affected by oxygen gas in the case of a single gas feed pipe.

Figure 4:
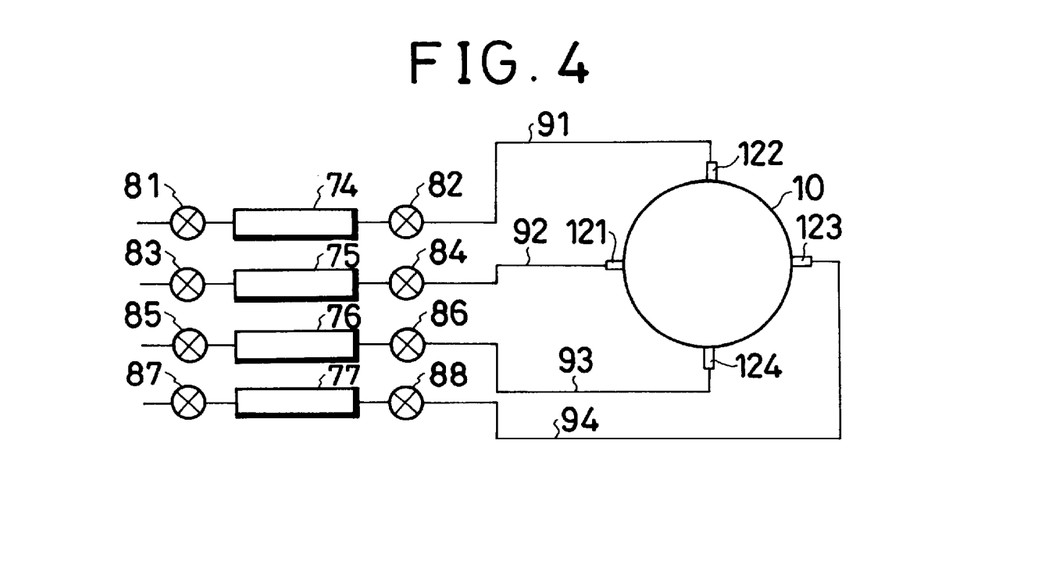
FIG. 4 is a block diagram for explaining a semiconductor manufacturing apparatus according to a second embodiment of the present invention.

Second embodiment:

FIG. 4 is a block diagram for explaining a semiconductor manufacturing apparatus according to a second embodiment of the present invention.

The second embodiment is similar to the first embodiment except that mass flow controllers 74 to 77 are respectively connected to the gas inlet portions 121 to 124 of the gas feed pipes 111 to 114 for allowing independent control over gas flow rate for each of the gas feed pipes 111 to 114. The gas inlet portion 121 is connected to a gas feed piping 92 having a valve 84, a mass flow controller 75, and valve 83. The gas inlet portion 122 is connected to a gas feed piping 91 having a valve 82, a mass flow controller 74, and valve 81. The gas inlet portion 123 is connected to a gas feed piping 94 having a valve 88, a mass flow controller 77, and valve 87. The gas inlet portion 124 is connected to a gas feed piping 93 having a valve 86, a mass flow controller 76, and valve 85.

According to the present embodiment, the gas flow rate can be controlled independently for each of the gas feed pipes 111 to 114. Accordingly, when a region having a higher temperature than the rest occurs on the surfaces of the wafers 200, for example, when the portions of the wafers 200 adjacent to the gas feed pipe 111 have a higher temperature than the rest with a resultant thicker film at those portions, the temperature of the portions can be reduced by increasing the gas flow rate of the gas feed pipe 111. This results in a thermal oxidation film having a uniform film thickness.

Figure 5:
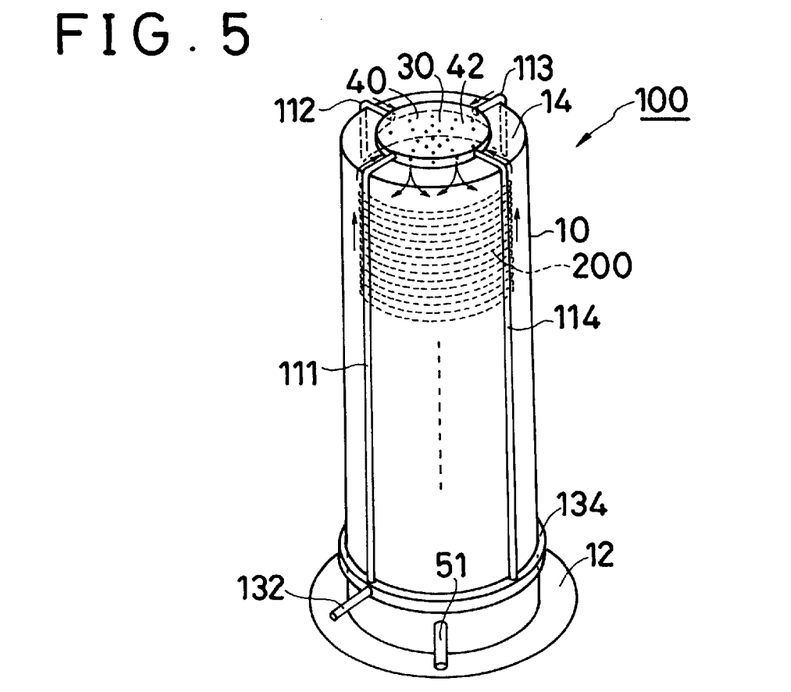
FIG. 5 is a perspective view for explaining a reaction tube used in a semiconductor manufacturing apparatus according to a third embodiment of the present invention.

Third embodiment:

FIG. 5 is a perspective view of for explaining a reaction tube used in a semiconductor manufacturing apparatus according to a third embodiment of the present invention.

The present invention is similar to the first embodiment except that a connecting gas pipe 134 communicating with the gas inlet portions of the gas feed pipes 111 to 114 is provided at the bottom portion of the reaction tube body 10 and that one gas supply pipe 132 is provided communicating with the connecting gas pipe 134.

Figure 6:
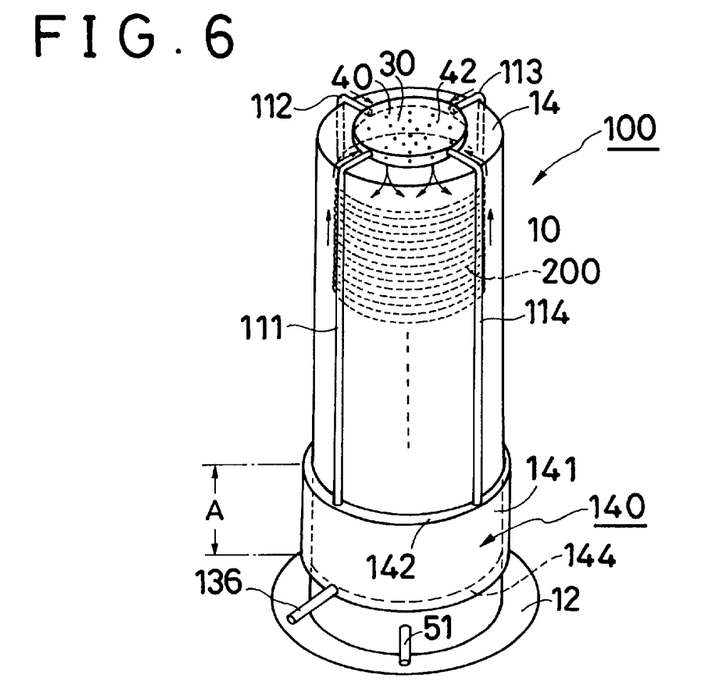
FIG. 6 is a perspective view of for explaining a reaction tube used in a semiconductor manufacturing apparatus according to a fourth embodiment of the present invention.
Figure 7A:
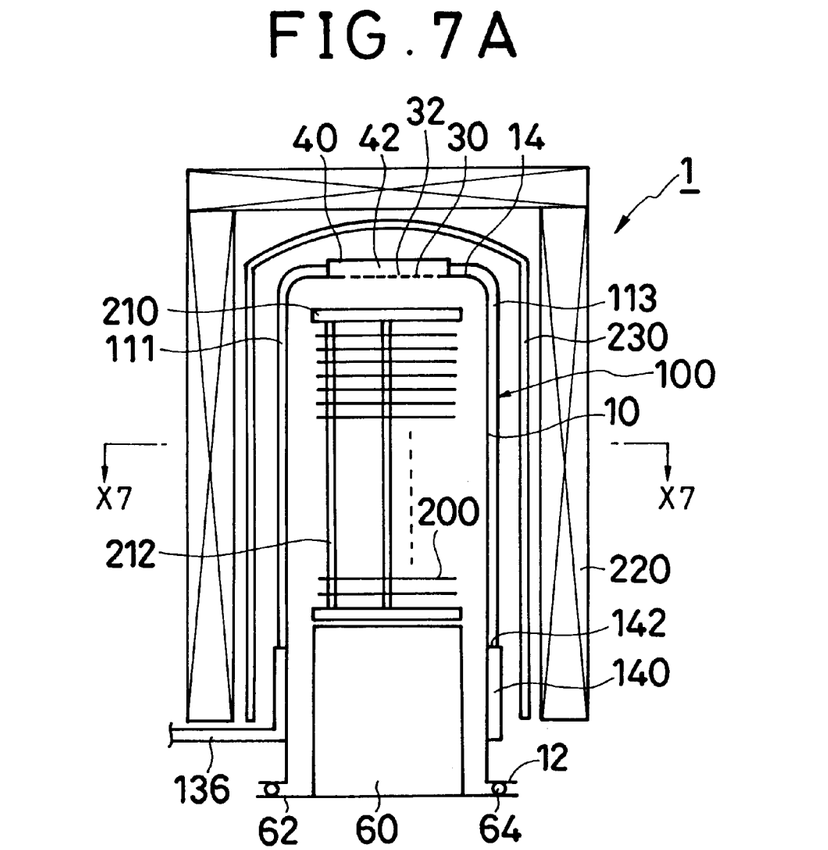
FIG. 7A is a cross-sectional view for explaining the semiconductor manufacturing apparatus according to the fourth embodiment.
Figure 7B:
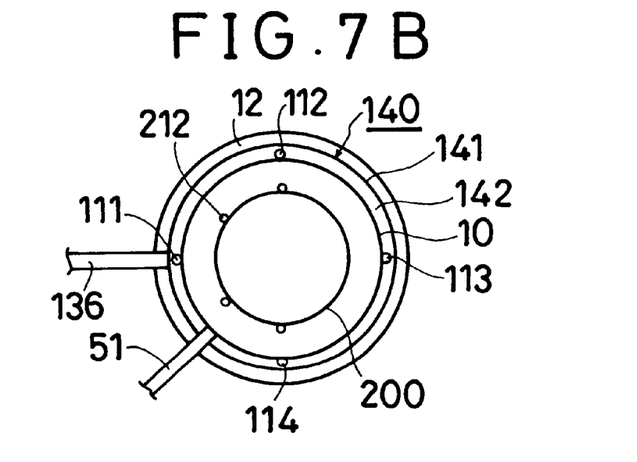
FIG. 7B is a cross-sectional view taken along a line X7—X7 of FIG. 7A.
Figure 8:
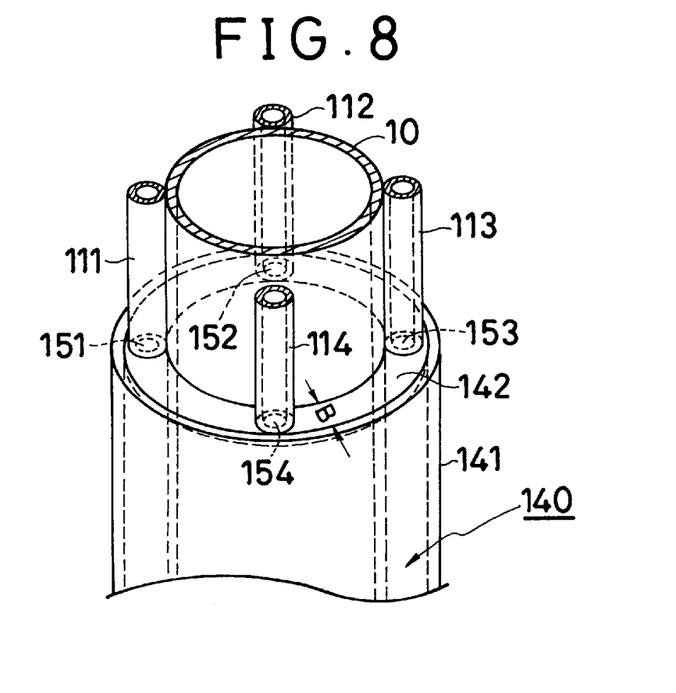
FIG. 8 is a partially enlarged perspective view for explaining a reaction tube used in the semiconductor manufacturing apparatus according to the fourth embodiment.

Fourth embodiment:

FIG. 6 is a perspective view for explaining a reaction tube used in a semiconductor manufacturing apparatus according to a fourth embodiment of the present invention. FIG. 7A is a cross-sectional view for explaining the semiconductor manufacturing apparatus according to the fourth embodiment. FIG. 7B shows a cross-section taken along the line X7—X7 of FIG. 7A. FIG. 8 is a partially enlarged perspective view of for explaining the reaction tube used in the semiconductor manufacturing apparatus according to the fourth embodiment.

In the present embodiment, a gas distribution chamber 140 is provided at the lower portion of the reaction tube body 10. The gas distribution chamber 140 is provided along the circumference surface of the reaction tube 10 and around the reaction tube body 10 and has a length A in the generatrix direction of the reaction tube body 10.

The gas distribution chamber 140 is defined by the following members: the reaction tube body 10, a cylindrical outer reaction tube 141 disposed coaxially to the reaction tube body 10 and disposed outside the reaction tube body 10, a ceiling plate 142 extending between the upper end portion of the outer reaction tube 141 and the reaction tube body 10, and a bottom plate 144 extending between the lower end portion of the outer reaction tube 141 and the reaction tube body 10.

Gas outlet holes 151 to 154 are formed in the ceiling plate 142 at constant angular intervals of 90°. The gas feed pipes 111 to 114 are disposed around the reaction tube body 10 at constant angular intervals of 90° such that they extend in the generatrix direction of the reaction tube body 10 and in the vertical direction. The lower ends of the gas feed pipes 111 to 114 communicate with the gas distribution chamber 140 through the gas outlet holes 151 to 154, respectively. The inner diameter of the gas feed pipes 111 to 114 is identical to the diameter of the gas outlet holes 151 to 154.

A gas supply pipe 136 is provided underneath the gas feed pipe 111 and at the lower end portion of the outer reaction tube 141 such that it communicates with the gas distribution chamber 140.

Oxygen gas supplied from the gas supply pipe 136 is distributed via the gas distribution chamber 140. When the distributed oxygen gas reaches the gas outlet holes 151 to 154, its flow rate at each gas outlet hole is considerably uniformalized or becomes substantially the same level. In order to make the flow rate of outgoing gas identical at the gas outlet holes 151 to 154, the flow resistance between the gas supply pipe 136 and the gas outlet holes 151 to 154, which is determined by the height A and the width B of the gas distribution chamber 140, must be sufficiently small as compared with the resistance of the gas outlet holes 151 to 154.

Preferably, the gas distribution chamber 140 is provided at a position lower than the wafers 200 loaded on the boat 210. This prevents variations in temperature in a wafer processing region.

In order for the gas distribution chamber 140 to function as a gas distribution chamber, it is not necessary for the gas distribution chamber 140 to be disposed within the heater 220 and the liner tube 230. The gas distribution chamber 140 may be disposed below and outside the heater 220 and the liner tube 230.

As shown in FIG. 7A, when the gas distribution chamber 140 is disposed within the heater 220 and the liner tube 230, it serves not only as a gas distribution chamber but as a gas heating chamber for preheating gas. Gas supplied from the gas supply tube 136 is preheated before it is led into the gas feed pipes 111 to 114. This suppresses the effect of cooling by gas flowing through the gas feed pipes 111 to 114. When gas is sufficiently heated in the gas distribution chamber 140 and reaches substantially the same temperature as that of the furnace and the wafers 200 before it is led into the gas feed pipes 111 to 114, a uniform temperature distribution is established over the surfaces of the wafers 200 and consequently the thickness of an oxide film becomes uniform over the wafer surfaces without disposing the gas feed pipes 111 to 114 around the reaction tube body 10 at a constant pitch. In order that the gas distribution chamber 140 also functions as a heating chamber, it is preferred that the height of the gas distribution chamber 140 within the heater 220 and the liner tube 230 be about 200 to 400 mm. When the gas distribution chamber 140 functions as a gas heating chamber, it is preferred that the gas distribution chamber 140 be disposed below the wafers 200 loaded on the boat 210. This prevents variations in temperature in a wafer processing region.

Figure 9A:
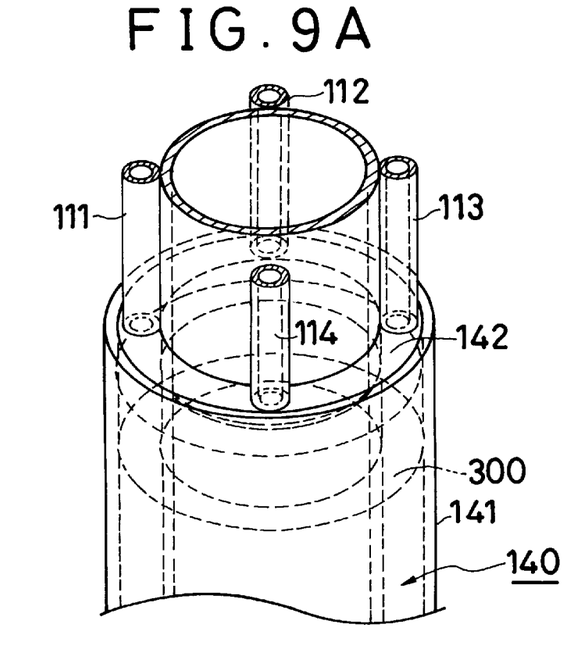
FIG. 9A is a partially enlarged perspective view for explaining a reaction tube used in a semiconductor manufacturing apparatus according to a fifth embodiment of the present invention.
Figure 9B:
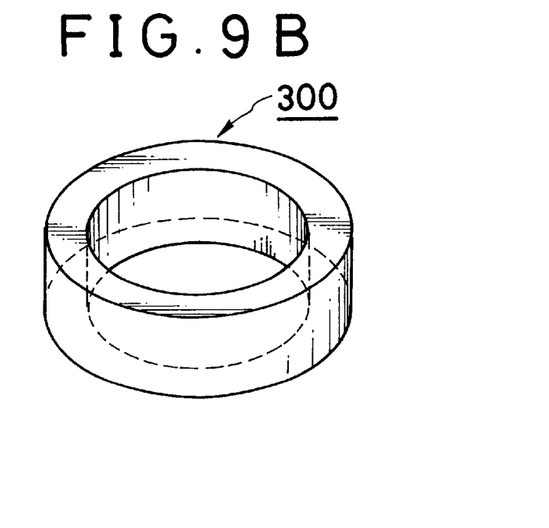
FIG. 9B is a perspective view for explaining a porous material used in the semiconductor manufacturing apparatus according to the fifth embodiment.

Fifth embodiment:

FIG. 9A is a partially enlarged perspective view for explaining a reaction tube used in a semiconductor manufacturing apparatus according to a fifth embodiment of the present invention. FIG. 9B is a perspective view for explaining a porous material used in the semiconductor manufacturing apparatus according to the fifth embodiment.

In the present embodiment, a ring-like porous material 300 is disposed within the gas distribution chamber 140. This provides more uniform distribution of gas which is supplied into the gas distribution chamber 140 from the gas supply pipe 136. As a result, the gas feed pipes 111 to 114 have a more uniform gas flow rate.

Figure 10A:
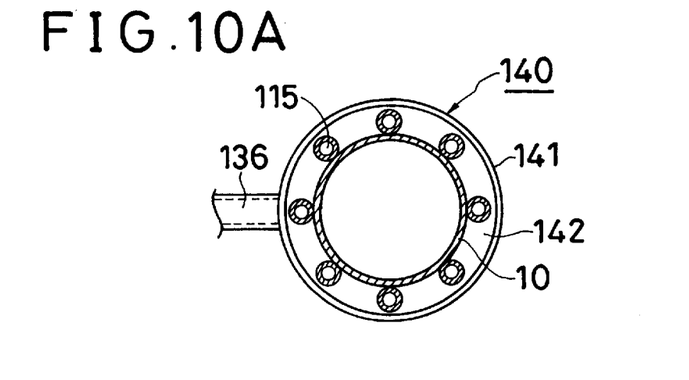
FIG. 10A is a cross-sectional view for explaining a reaction tube used in a semiconductor manufacturing apparatus according to a sixth embodiment of the present invention.
Figure 10B:
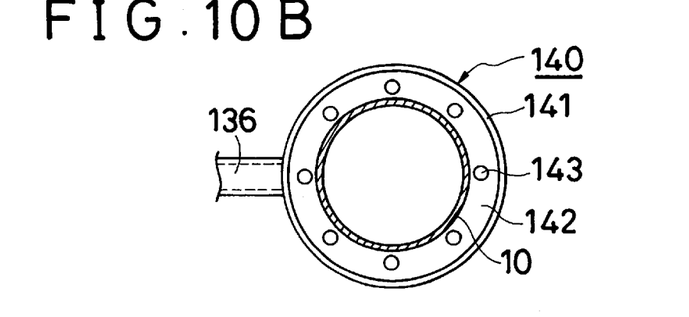
FIG. 10B is a cross-sectional view for explaining the reaction tube used in the semiconductor manufacturing apparatus according to the sixth embodiment.

Sixth embodiment:

FIGS. 10A and 10B are cross-sectional views for explaining a reaction tube used in a semiconductor manufacturing apparatus according to a sixth embodiment of the present invention.

In the present embodiment, eight gas feed pipes 115 are disposed around the reaction tube body 10 at constant intervals of 45°. The gas feed pipes 115 communicate with the gas distribution chamber 140 via eight gas outlet holes 143 provided in the ceiling plate 142. The eight gas outlet holes 143 are disposed around the reaction tube body 10 at constant angular intervals of 45°. The inner diameter of the gas feed pipes 115 is identical to the diameter of the gas outlet holes 143.

Figure 11A:
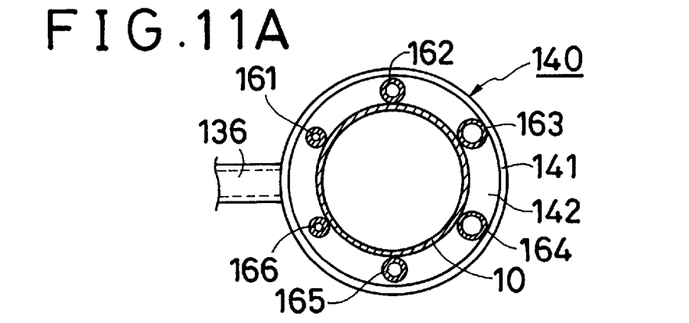
FIG. 11A is a cross-sectional view for explaining a reaction tube used in a semiconductor manufacturing apparatus according to a seventh embodiment of the present invention.
Figure 11B:
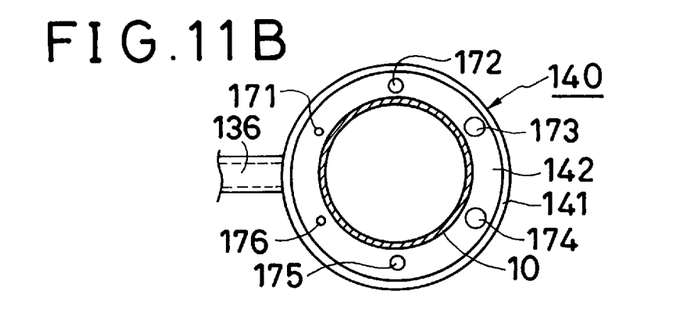
FIG. 11B is a cross-sectional view for explaining the reaction tube used in the semiconductor manufacturing apparatus according to the seventh embodiment.

Seventh embodiment:

FIGS. 11A and 11B are cross-sectional views for explaining a reaction tube used in a semiconductor manufacturing apparatus according to a seventh embodiment of the present invention.

In the present embodiment, six gas feed pipes 161 to 166 are disposed around the reaction tube body 10 spaced equally at a dividing angle of 60°. The gas feed pipes 116 to 166 communicate with the gas distribution chamber 140 via six gas outlet holes 171 to 176 provided in the ceiling plate 142 and spaced equally around the reaction tube body 10 at constant angular intervals of 60°.

The inner diameters of the gas feed pipes 161 and 166 and the diameters of the gas outlet holes 171 and 176 are equal to each other. The inner diameters of the gas feed pipes 162 and 165 and the diameters of the gas outlet holes 172 and 175 are equal to each other. The inner diameters of the gas feed pipes 163 and 164 and the diameters of the gas outlet holes 173 and 174 are equal to each other.

The gas feed pipes 161 to 166 located more distant from the gas supply pipe 136 have a larger inner diameter. Likewise, the gas outlet holes 171 to 176 located more distant from the gas supply pipe 136 have a larger diameter. Accordingly, a more uniform gas flow rate is obtained for the gas feed pipes 161 to 166 as compared to the case where the gas feed pipes 161 to 166 have an equal inner diameter and the gas outlet holes 171 to 176 have an equal diameter. As a result, a more uniform temperature distribution over the surface of a wafer is obtained, resulting in an improved uniformity of oxide film thickness over the surface of a wafer.

Figure 12A:
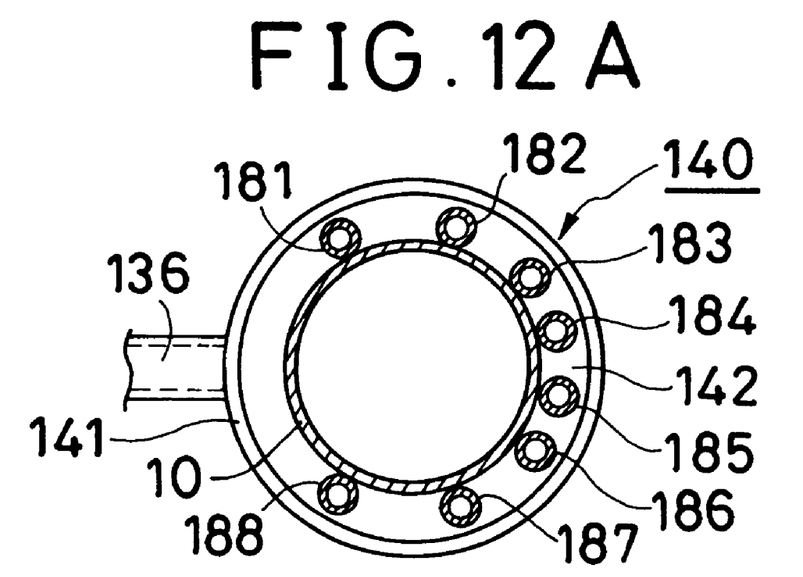
FIG. 12A is a cross-sectional view for explaining a reaction tube used in a semiconductor manufacturing apparatus according to an eighth embodiment of the present invention.
Figure 12B:
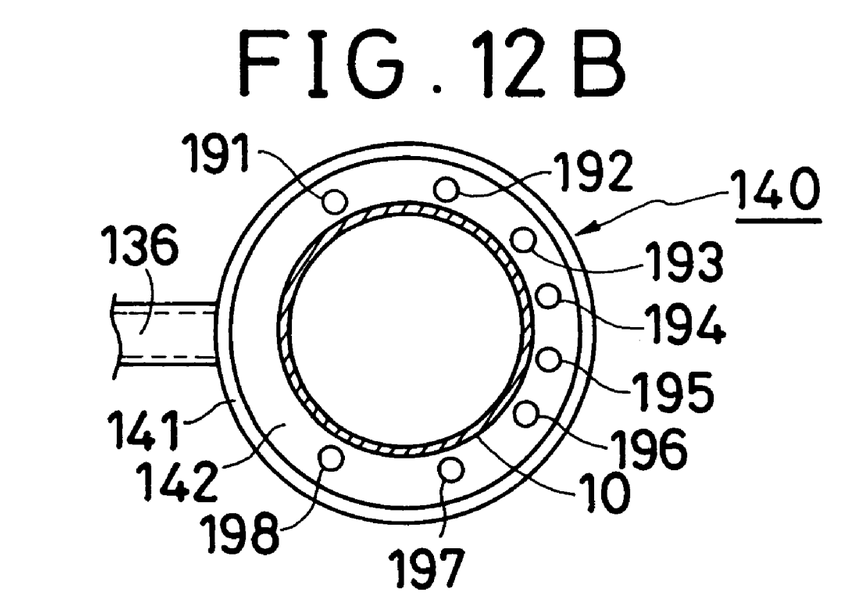
FIG. 12B is a cross-sectional view for explaining the reaction tube used in the semiconductor manufacturing apparatus according to the eighth embodiment of the present invention.

Eighth embodiment:

FIGS. 12A and 12B are cross-sectional views for explaining a reaction tube used in a semiconductor manufacturing apparatus according to an eighth embodiment of the present invention.

In the present embodiment, eight gas feed pipes 181 to 188 are provided around the reaction tube body 10 such that they extend along the peripheral surface of the reaction tube body 10. The pitch of the gas feed pipes 181 to 188 gradually decreases from a side where the gas supply pipe 136 is located toward the opposite side. Accordingly, the effect of cooling by gas flowing through the gas feed pipes 181 to 188 becomes more uniform around the reaction tube body 10 as compared to the case where the gas feed pipes 181 to 188 are disposed at a constant pitch. As a result, a more uniform temperature distribution over the surface of a wafer is obtained, resulting in an improved uniformity of oxide film thickness over the surface of a wafer.

The gas feed pipes 181 to 188 communicate with the gas distribution chamber 140 through gas outlet holes 191 to 198 formed in the ceiling plate 142. The pitch of the gas outlet holes 191 to 198 also gradually decreases from a side where the gas supply pipe 136 is located toward the opposite side. The inner diameters of the gas feed pipes 181 to 188 and the diameters of the gas outlet holes 191 to 198 are equal to each other.

Figure 13:
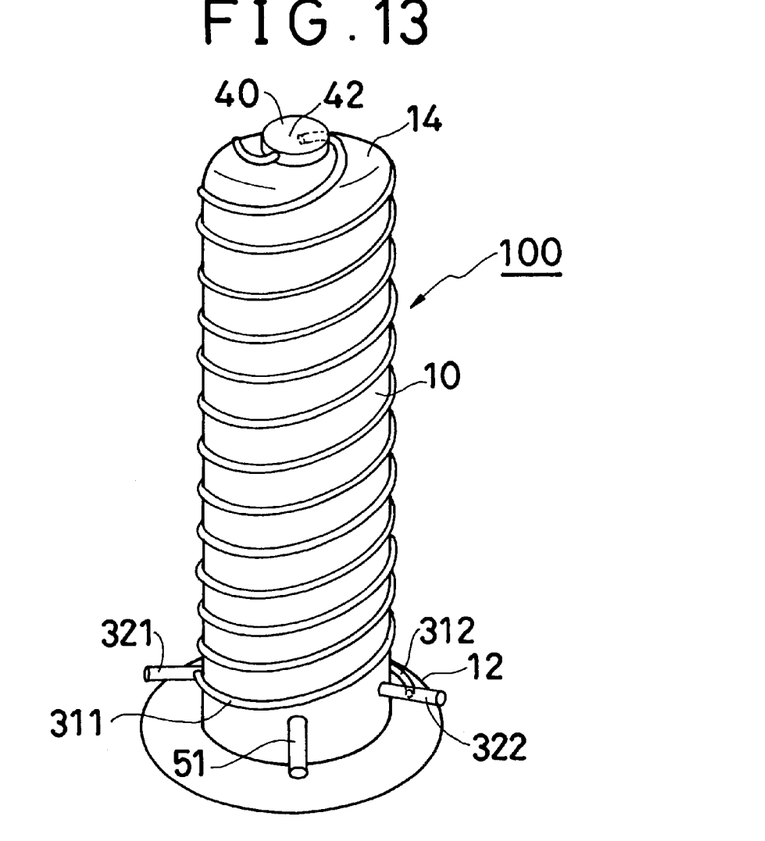
FIG. 13 is a perspective view for explaining a reaction tube used in a semiconductor manufacturing apparatus according to a ninth embodiment of the present invention.

Ninth embodiment:

FIG. 13 is a perspective view for explaining a reaction tube used in a semiconductor manufacturing apparatus according to a ninth embodiment of the present invention.

In the present embodiment, the reaction tube 100 is provided with the reaction tube body 10 and two gas feed pipes 311 and 312. The gas feed pipes 311 and 312 are spirally wound around the reaction tube body 10. Gas inlet portion 321 and 322 are provided at lower end portions (upstream-side end portions) of the gas feed pipes 311 and 312, respectively. The upper-end portions (downstream-side end portions) of the gas feed pipes 311 and 312 communicate with the shower chamber 42 at diametrically facing positions. Since the gas feed pipes 311 and 312 are spirally wound around the reaction tube body 10, the effect of cooling by gas flowing through the gas feed pipes 311 and 312 can be dispersed. As a result, a more uniform temperature distribution over the surface of a wafer is obtained, resulting in an improved uniformity of oxide film thickness over the surface of a wafer.

Figure 14:
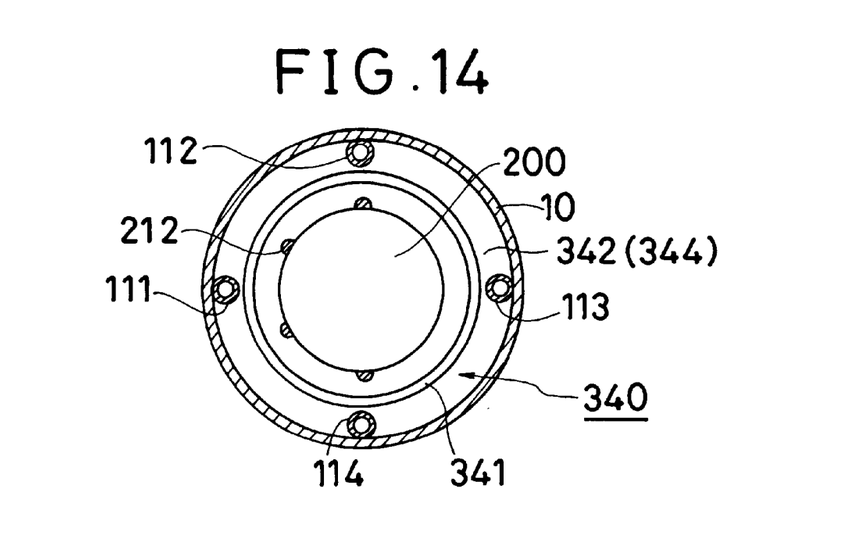
FIG. 14 is a cross-sectional view for explaining a reaction tube used in a semiconductor manufacturing apparatus according to a tenth embodiment of the present invention.

Tenth embodiment:

FIG. 14 is a cross-sectional view for explaining a reaction tube used in a semiconductor manufacturing apparatus according to a tenth embodiment of the present invention.

In the present embodiment, a gas distribution chamber 340 is disposed within the reaction tube body 10. The gas distribution chamber 340 is provided along the inside circumference surface of the reaction tube 10 and around the reaction tube body 10 and has a predetermined length in the generatrix direction of the reaction tube body 10.

The gas distribution chamber 340 is defined by the following members: the reaction tube body 10, an cylindrical inner reaction tube 341 disposed coaxially to the reaction tube body 10 and disposed inside the reaction tube body 10, a ceiling plate 342 disposed between the upper end portion of the inner reaction tube 341 and the reaction tube body 10, and a bottom plate 344 disposed between the lower end portion of the inner reaction tube 341 and the reaction tube body 10.

Gas feed pipes 111 to 114 are provided on the ceiling plate 342 to communicate with the gas distribution chamber 340.

The gas feed pipes 111 to 114 are disposed in the reaction tube body 10 at constant angular intervals of 90° such that they extend in the generatrix direction and in the vertical direction along the inner circumference surface of the reaction tube body 10.

As a result of the gas distribution chamber 340 and the gas feed pipes 111 to 114 being disposed within the reaction tube body 10, the reaction tube 100 becomes easier to wash. That is, when the reaction tube 100 is washed in a washing chemical while the reaction tube 100 is laid on its side and supported on rollers or similar supporting members and further rotated on the rollers, the gas feed pipes 111 to 114 do not hit against or are not caught by the supporting members, so that the reaction tube 100 rotates smoothly and is not damaged. Also, as a result of disposing the gas distribution chamber 340 inside the reaction tube body 10, the gas distribution chamber 340 becomes flush with the reaction tube body 10, resulting in smooth rotation of the reaction tube 100 during washing.

Each of the embodiments described above is provided with a predetermined number of gas feed pipes, which may be more than one, such as 2, 3, 4 or more, as needed. Also, a single gas feed pipe may branch into a plurality of pipes such that gas is discharged from around the gas shower plate 30 at equally spaced positions. Gas may be directly introduced into the reaction tube body 10 without passing through the gas shower plate 30. Further, in the above-described embodiments, the apparatus of the present invention is applied to dry oxidation process using oxygen gas. However, the present invention is also effective for various processes for semiconductor wafers such as wet oxidation using a pyrogenic method, phosphorous diffusion, and various thermal processes.

What is claimed is:

1. A semiconductor manufacturing apparatus, comprising:
   a heating device;
   a reaction tube disposed within said heating device, said reaction tube having a gas inlet portion and an exhaust portion parted from each other by a predetermined distance in the longitudinal direction of said reaction tube; and
   a plurality of gas feed pipes extending along a side wall of said reaction tube from the exhaust portion side to said gas inlet portion, said plurality of gas feed pipes being parted from each other,
   wherein said reaction tube has a circular cross-section,
   wherein said plurality of gas feed pipes are disposed around said reaction tube at substantially constant intervals.

2. A semiconductor manufacturing apparatus, comprising:
   a heating device;
   a reaction tube disposed within said heating device, said reaction tube having a gas inlet portion and an exhaust portion parted from each other by a predetermined distance in the longitudinal direction of said reaction tube;
   a plurality of gas feed pipes extending along a side wall of said reaction tube from the exhaust portion side to said gas inlet portion, said plurality of gas feed pipes being parted from each other; and
   a gas supply apparatus capable of independently controlling a flow rate of gas to be supplied to each of said plurality of gas feed pipes.

3. A semiconductor manufacturing apparatus, comprising:
   a heating device;
   a reaction tube disposed within said heating device, said reaction tube having a gas inlet portion and an exhaust portion parted from each other by a predetermined distance in the longitudinal direction of said reaction tube;
   a plurality of gas feed pipes extending along a side wall of said reaction tube from the exhaust portion side to said gas inlet portion, said plurality of gas feed pipes being parted from each other;
   a connecting pipe communicating with a gas inlet portion of each of said plurality of gas feed pipes and being provided along the side wall of said reaction tube; and
   a gas supply pipe communicating with said connecting pipe.

4. A semiconductor manufacturing apparatus, comprising:
   a heating device;
   a reaction tube disposed within said heating device, said reaction tube having a gas inlet portion and an exhaust portion parted from each other by a predetermined distance in the longitudinal direction of said reaction tube;
   a plurality of gas feed pipes extending along a side wall of said reaction tube from the exhaust portion side to said gas inlet portion, said plurality of gas feed pipes being parted from each other;
   a gas distribution chamber provided along the side wall of said reaction tube at the exhaust portion side, said gas distribution chamber being provided around said reaction tube and having a predetermined length in the longitudinal direction, and one longitudinal end portion of said gas distribution chamber communicating with the gas inlet portion of each of said plurality of gas feed pipes; and
   a gas supply pipe communicating with said gas distribution chamber, said gas supply pipe being provided at a position longitudinally separated by a predetermined distance from the one end portion of said gas distribution chamber toward the other end portion of said gas distribution chamber.

5. A semiconductor manufacturing apparatus as recited in claim 4, further comprising a porous material disposed within said gas distribution chamber.

6. A semiconductor manufacturing apparatus as recited in claim 4, wherein the inner diameter of each of said plurality of gas feed pipes and the diameter of each of gas outlet holes provided between said plurality of gas feed pipes and said gas distribution chamber are gradually increased from a side where said gas supply pipe exists toward the opposite side.

7. A semiconductor manufacturing apparatus as recited in claim 4, wherein the pitch of said plurality of gas feed pipes is gradually decreased from a side where said gas supply pipe exists toward the opposite side.

8. A semiconductor manufacturing apparatus as recited in claim 4, wherein said plurality of gas feed pipes are wound around the side wall of said reaction tube.

9. A semiconductor manufacturing apparatus as recited in claim 4, wherein at least either of said plurality of gas feed pipes and said gas distribution chamber is disposed inside said reaction tube.

10. A semiconductor manufacturing apparatus as recited in claim 4, wherein at least part of said gas distribution chamber is disposed within said heating means.

11. A substrate processing method for processing a substrate using a semiconductor manufacturing apparatus including a heating device, a reaction tube disposed within the heating device, the reaction tube having a gas inlet portion and an exhaust portion parted from each other by a predetermined distance in the longitudinal direction of the reaction tube, a plurality of gas feed pipes extending along a side wall of the reaction tube from the exhaust portion side to the gas inlet portion, the plurality of gas feed pipes being parted from each other, and a gas supply apparatus capable of independently controlling a flow rate of gas to be supplied to each of the plurality of gas feed pipes, wherein the supply rate of gas supplied to at least one of the gas feed pipes located adjacently to a higher-temperature region of a surface of a substrate is made greater than the supply rate of gas supplied to the rest of the gas feed pipes.

12. A semiconductor manufacturing apparatus, comprising:

a heating device;

a reaction tube disposed within said heating device, said reaction tube having a gas inlet portion and an exhaust portion parted from each other by a predetermined distance in the longitudinal direction of said reaction tube; and a first gas feed pipe and a second gas feed pipe each extending along a side wall of said reaction tube from the exhaust portion side to said gas inlet portion, said first and second gas feed pipes being spaced from each other at an angular interval of equal to or more than 90°.

* * * * *